United States Patent
Summerfelt

[11] Patent Number: 5,825,055
[45] Date of Patent: Oct. 20, 1998

[54] FABRICATING HIGH-DIELECTRIC CONSTANT OXIDES ON SEMICONDUCTORS USING A GE BUFFER LAYER

[75] Inventor: Scott R. Summerfelt, Dallas, Tex.

[73] Assignee: Texas Instruments Incorporated, Dallas, Tex.

[21] Appl. No.: 774,713

[22] Filed: Jan. 3, 1997

Related U.S. Application Data

[60] Continuation of Ser. No. 479,986, Aug. 21, 1995, abandoned, which is a division of Ser. No. 223,085, Apr. 4, 1994, Pat. No. 5,473,171, which is a division of Ser. No. 877,287, May 1, 1992, Pat. No. 5,326,721.

[51] Int. Cl.$^6$ .................................................. H01L 29/161
[52] U.S. Cl. .......................... 257/183; 257/200; 257/616; 257/631; 257/632
[58] Field of Search ................................... 257/280, 183, 257/200, 616, 631, 632

[56] References Cited

U.S. PATENT DOCUMENTS

| | | | |
|---|---|---|---|
| 3,496,037 | 2/1970 | Jackson et al. | 148/175 |
| 4,945,710 | 8/1990 | Miller et al. | 427/126.3 |
| 5,028,455 | 7/1991 | Miller et al. | 427/126.3 |
| 5,116,643 | 5/1992 | Miller et al. | 427/126.3 |
| 5,168,330 | 12/1992 | Vitkavage | 257/280 |

FOREIGN PATENT DOCUMENTS

| | | | |
|---|---|---|---|
| 61-241911(A) | 4/1985 | Japan . | |
| 61-241911 | 10/1986 | Japan | 257/280 |
| 63-140521 (A) | 12/1986 | Japan . | |
| 91-165723/23 | 11/1989 | WIPO . | |

OTHER PUBLICATIONS

Light et al, "An integration approach for Ge", IBM Tech Disc Bul, vol. 9, No. 10, Mar. 1967.
Barfoot and Taylor, *Polar Dielectrics and Their Applications*, p. 5.
Sinharoy, et al., Growth and the Microstructural and Ferroelectric Characterization of Oriented BaMgF4 Thin Films, Nov. 1991, *IEEE Transactions on Ultrasonics*, pp. 663–671.
Sinharoy, et al., *Growth and Characterization of ferroelectric BaMgF4 films*, Dec. 1990, pp. 409–413.
Dharmadhikari & Grannemann, *AES Study on the Chemical Composition of Ferroelectric BaTiO$_3$ Thin Films rf Sputter–Deposited on Silicon*, Jun. 1983, pp. 483–485.
Horwitz et al., *In situ deposition of Epitaxial PbZr$_x$TI$_{(1-x)}$O$_3$ thin films by pulsed laser deposition*, 1991, p. (3).
Vasant Kumar et al., *Crystallization of sputtered lead zirconate titanate films by rapid thermal processing*, Oct. 91, pp. 864–874.

(List continued on next page.)

*Primary Examiner*—Edward Wojciechowicz
*Attorney, Agent, or Firm*—Brian A. Carlson; James C. Kesterson; Richard L. Donaldson

[57] ABSTRACT

This is a method for fabricating a structure useful in semiconductor circuitry. The method comprises: growing a germanium layer 28 directly or indirectly on a semiconductor substrate 20; and depositing a high-dielectric constant oxide 32 (e.g. a ferroelectric oxide) on the germanium layer. Preferably, the germanium layer is epitaxially grown on the semiconductor substrate. This is also a semiconductor structure, comprising: a semiconductor substrate; a germanium layer on the semiconductor substrate; and a high-dielectric constant oxide on the germanium layer. Preferably the germanium layer is single-crystal. Preferably the substrate is silicon and the germanium layer is less than about 1 nm thick or the substrate is gallium arsenide (in which case the thickness of the germanium layer is not as important). A second germanium layer 40 may be grown on top of the high-dielectric constant oxide and a conducting layer 42 (possibly epitaxial) grown on the second germanium layer. Preferably the high-dielectric constant oxide is a titanate, such as barium strontium titanate. When the high-dielectric constant oxide is a lead-containing titanate 34, a buffer layer of non-lead-containing titanate 32 is preferably utilized between the germanium layer and the lead-containing titanate.

14 Claims, 1 Drawing Sheet

OTHER PUBLICATIONS

Koyama et al., *IEEE*, A Stacked Capacitor With $(Ba_xSr_{1-x})TiO_3$ for 256M Dram, 1991, pp. 823–826.

T.B. Light et al., *IBM Technical Disclosure Bulletin*, An Integration Approach for Ge, Mar. 1967, pp. 1446–1447.

McClure et al., *Characterization of amorphous barium titanate films prepared by rf sputtering*, pp. 311–313.

Miyasaka et al., *IEEE*, Dielectric Properties of Sputter–Deposited $BaTiO_3$–$SrTIO_3$ Thin Films, 1991, pp. 121–124.

Panitz et al., *1979 American Vacuum Society*, Radio–Frequency–sputtered tetragonal barium titanate films on silicon, Apr. 1979, pp. 315–318.

Pinizzotto et al., *Centers for Materials Characterization*, Cross–sectional Tem Studies on Barium Strontium Titanate Deposited on Silicon By Pulsed Laser Ablation, pp. 1–6.

Sakuma et al., *American Institute of Physics*, Barrier layers for realization of high capacitance density in $SrTiO_3$ thin–film capacitor on silicon, Dec. 1990, pp. 2431–2433.

Scott R. Summerfelt, *Texas Instruments*, The Epitactic Growth of Oxions on Si, p. (6).

Yamamichi et al., *Fundamentals Research Laboratories, NEC*, $SrTio_3$ Thin Film Preparation by Ion Beam Sputtering and Its Dielectric Properties, Jul. 1991, pp. 2193–2196.

FABRICATING HIGH-DIELECTRIC CONSTANT OXIDES ON SEMICONDUCTORS USING A GE BUFFER LAYER

This application is a Continuation of application Ser. No. 08/479,986 filed on Aug. 21, 1995, now abandoned, which is a Division of application Ser. No. 08/223,085, filed Apr. 4, 1994, now U.S. Pat. No. 5,473,171 issued Dec. 05, 1995, which is a Division of Ser. No. 07/877,287, filed May 1, 1992, now U.S. Pat. No. 5,326,721 issued Jul. 5, 1994.

BACKGROUND OF THE INVENTION

An arrangement of layers with an oxide between a conducting layers and a semiconductor is usable as a portion of many of the structures used in semiconductor circuitry, such as capacitors, MOS transistors, pixels for light detecting arrays, and electrooptic applications.

The integration of non-$SiO_2$ based oxides directly or indirect on Si is difficult because of the strong reactivity of Si with oxygen. The deposition of non-$SiO_2$ oxides on Si has generally resulted in the formation of a $SiO_2$ or silicate layer at the Si // oxide interface. This layer is generally amorphous and has a low dielectric constant. These properties degrade the usefulness of non-$SiO_2$ based oxides with Si. High-dielectric constant (HDC) oxide (e.g. a ferroelectric oxide) can have a large dielectric constant, a large spontaneous polarization, and a large electrooptic properties. Ferroelectrics with a large dielectric constant can be used to form high density capacitors but can not deposited directly on Si because of the reaction of Si to form a low dielectric constant layer. Such capacitor dielectrics have been deposited on "inert" metals such as Pt, but even Pt or Pd must be separated from the Si with one or more conductive buffer layers.

Putting the high dielectric material on a conductive layer (which is either directly on the semiconductor or on an insulating layer which is on the semiconductor) has not solved the problem. Of the conductor or semiconductor materials previously suggested for use next to high dielectric materials in semiconductor circuitry, none of these materials provides for the epitaxial growth of high dielectrical materials on a conductor or semiconductor. Further, the prior art materials generally either form a silicide which allows the diffusion of silicon into the high dielectric materials, or react with silicon or react with the high dielectric oxide to form low dielectric constant insulators.

The large spontaneous polarization of ferroelectrics when integrated directly on a semiconductor can also be used to form a non-volatile, non-destructive readout, field effect memory. This has been successfully done with non-oxide ferroelectrics such as $(Ba,Mg)F_2$ but not so successfully with oxide ferroelectrics because the formation of the low dielectric constant $SiO_2$ layer acts to reduce the field within the oxide. The oxide can also either poison the Si device or create so many interface traps that the device will not operate properly.

Ferroelectrics also have interesting electrooptic applications where epitaxial films are preferred in order to reduce loss due to scattering from grain boundaries and to align the oxide in order to maximize its anisotropic properties. The epitaxial growth on Si or GaAs substrates has previously been accomplished by first growing a very stable oxide or fluoride on the Si or GaAs as a buffer layer prior to growing another type of oxide. The integration of oxides on GaAs is even harder than Si because the GaAs is unstable in $O_2$ at the normal growth temperatures 450° C.–700° C.

SUMMARY OF THE INVENTION

A Ge buffer layer directly or indirectly on Si oxidizes much less readily and can be used to prevent or minimize the formation of the low dielectric constant layer. An epitaxial Ge layer on Si provides a good buffer layer which is compatible with Si and also many oxides. Unlike other buffer layers, Ge is a semiconductor (it can also be doped to provide a reasonably highly conductive layer) and is compatible with Si process technology. The epitaxial growth of Ge on top of the ferroelectric or high-dielectric constant oxide is also much easier than Si which makes it possible to form three dimensional epitaxial structures. The Ge buffer layer can be epitaxially grown on the Si substrate allowing the high dielectric constant oxide to be epitaxially grown on the Ge and hence epitaxially aligned to the Si substrate. The epitaxial Ge layer allows ferroelectrics to be directly grown on Si wafers to form non-volatile non-destructive read out memory cells. The Ge buffer layer will also increase the capacitance of large dielectric constant oxide films compared to films grown directly on Si. A Ge buffer layer on the Si or GaAs substrate allows many more oxides to be epitaxially grown on it because of the much smaller chemical reactivity of Ge with oxygen compared to Si or GaAs with oxygen.

Generally the prior art conductive materials suggested for interfacing with high dielectric constant oxides in semiconductor circuitry either have reacted with the high dielectric constant oxides or with the semiconductor and/or have not provided a diffusion barrier between the high dielectric constant oxides and semiconductor material.

As, noted, the integration of oxides on GaAs is even harder than Si because the GaAs is unstable in $O_2$ at the normal growth temperatures of high-dielectric constant oxide (450° C.–700° C.). A epitaxial Ge buffer layer solves this problem and simplifies the integration of ferroelectrics on GaAs for the same applications as listed above.

This is a method for fabricating a structure useful in semiconductor circuitry. The method comprises: growing a germanium layer on a non-germanium semiconductor substrate; and depositing a high-dielectric constant oxide on the germanium layer. Preferably, the germanium layer is epitaxially grown on the semiconductor substrate.

This is also a structure useful in semiconductor circuitry comprising: a semiconductor substrate; a germanium layer on the semiconductor substrate; and a high-dielectric constant oxide on the germanium layer. Preferably the germanium layer is single-crystal.

Preferably the substrate is silicon and the germanium layer is less than about 1 nm thick or the substrate is gallium arsenide (in which case the thickness of the germanium layer is not as important). A second germanium layer may be grown on top of the high-dielectric constant oxide and a conducting layer (any layer may be epitaxial if the layer below it is single crystal) grown on the second germanium layer. Preferably the high-dielectric constant oxide is a titanate, such as barium strontium titanate. When the high-dielectric constant oxide is a lead-containing titanate, a buffer layer of non-lead-containing titanate is preferably utilized between the germanium layer and the lead-containing titanate. Preferably the high-dielectric constant oxide is a ferroelectric oxide.

BRIEF DESCRIPTION OF THE DRAWINGS

Further features of the present invention will become apparent from a description of the fabrication process and structure thereof, taken in conjunction with the accompanying drawings, in which.

DETAILED DESCRIPTION OF THE INVENTION

Figure 1:
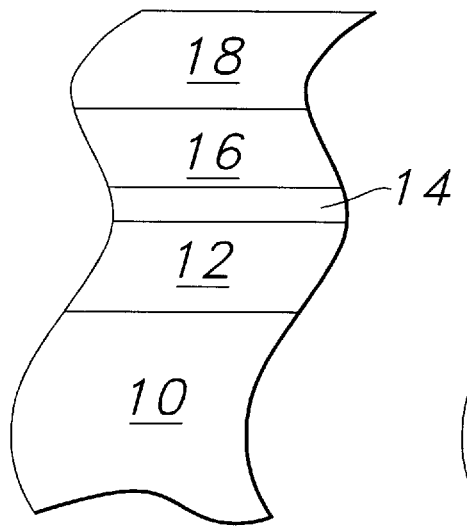
FIG. 1 shows a cross-section of one embodiment of a multi-layer structure using a polycrystalline Ge buffer layer.

As noted, the growth of HDC oxides on Si generally results in the oxidation of the Si and the formation of $SiO_2$ or a silicate layer. Further, this $SiO_2$ layer prevents the epitaxy of the deposited oxide and has a low dielectric constant and the integration of ferroelectrics and other large dielectric constant materials directly on Si is degraded by the formation of the low dielectric constant $SiO_2$ layer. Also as noted, putting the high dielectric material on a conductive layer (which is either directly on the semiconductor or on an insulating layer which is on the semiconductor) has not solved the problem.

A Ge buffer layer between non-$SiO_2$ oxides and Si reduces the reactivity of the Si surface and in general enhances the epitaxy and at least reduces the reaction layer between the deposited oxide and the Si substrate. The epitaxial growth of Ge on Si is compatible with current Si process technology. The main difficulty with Ge on Si is the 4% lattice mismatch which results in misfit dislocation on Ge films thicker than 1 nm. On silicon, the Ge layer is preferably very thin to avoid the misfit dislocations (however a thicker layer may be used for some devices if that is not detrimental to the performance of the device in question). In still other embodiments, polycrystalline Ge may be formed over silicon dioxide or polycrystalline Si (thus using the Ge as a chemical buffer layer between a deposited oxide and the Si substrate).

Depending on the application the choice of materials may be very different. For large density capacitors, currently the best linear dielectric appears to be $(Ba_{1-x},Sr_x)TiO_3$ (BST). $BaTiO_3$ (BT) or $SrTiO_3$ (ST) when deposited directly on Si forms a low dielectric constant layer, because BT and ST are not thermodynamically stable next to Si. Ge, however, has a much smaller free energy of oxidation and BT and ST are thermodynamically stable next to Ge. It is also possible to deposit BT and ST in a $H_2+O_2$ gas mixture such that Ge is stable and also BT or ST is stable while $GeO_2$ is not stable. Not all oxides are stable next to Ge. For example, all ferroelectrics containing Pb such as $Pb(Ti,Zr)O$ (PZT) are much less stable next to Ge (since PbO is not stable). A thin layer of $SrTiO_3$ or other stable ferroelectric can, however, be used as a buffer layer between the Pb containing ferroelectric and the Ge coated Si substrate. The $SrTiO_3$ not only acts as a chemical barrier, but also nucleates the desired perovskite structure (instead of the undesirable pyrochlore structure).

An epitaxial Ge buffer layer was used in experiments on a (100) Si substrate to deposit epitaxial BST. Without the Ge buffer layer, the BST was randomly oriented polycrystalline. With the Ge buffer layer, most of the BST has the following orientation relationship (110) BST ∥ (100) Si. This showed that the Ge buffer layer has prevented the formation of a low dielectric layer at the interface prior to epitaxy since that layer would prevent epitaxy.

The deposition of a ferroelectric directly on a semiconductor has been used by others to create a non-volatile nondestructive readout memory. This device is basically a MOS transistor where the $SiO_2$ has been replaced with a ferroelectric (metal-ferroelectric-semiconductor or MFS). One memory cell consists of a MFS transistor and a standard MOS transistor. This type of memory has many advantages including very fast read/write as well having nearly the same density as a standard DRAM cell. The remnant polarization in the ferroelectric can be used induce a field into the semiconductor and hence the device is non-volatile and non-destructive. This device has been successfully made by others using a $(Ba,Mg)F_2$ ferroelectric layer epitaxially grown by MBE on the Si substrate. Oxide perovskites such as PZT have also been studied for non-volatile memories but these materials can not be deposited directly on Si without reacting with the Si. A Ge buffer layer will allow many stable ferroelectrics, such as $BaTiO_3$, to be used in a RAM. A second buffer layer of $SrTiO_3$ or some other stable ferroelectric should allow even most chemically reactive ferroelectric oxides to be used to try to form a RAM. The Ge buffer layer would also allow this type of memory to be fabricated on GaAs and other III-V compounds in addition to Si. It also might be possible to fabricate a thin-film MFS transistor by depositing the Ge on top of the ferroelectric. The ferroelectric might be epitaxial on the GaAs or Si substrate or it might be polycrystalline. The compatibility of Ge with a stable ferroelectric buffer layer allows this structure to be manufactured.

In FIG. 1 there is shown one preferred embodiment (in all figures, an arrangement of layers is shown which is usable as a portion of many structures used in semiconductor circuitry, such as capacitors, MOS transistors, pixels for light detecting arrays, and electrooptic applications). FIG. 1 shows a semiconductor substrate 10, on which an silicon dioxide insulating layer 12 has been deposited, with a doped polycrystalline germanium layer 14 over the silicon dioxide 12 (the germanium can be highly doped to provide a highly conductive layer, and the germanium is polycrystalline, as it overlies an amorphous silicon dioxide layer). A ferroelectric barium strontium titanate layer 16 is deposited on the germanium layer, and a titanium-tungsten layer 18 is deposited atop the barium strontium titanate 16. As noted, such an arrangement of layers is usable in many semiconductor structures and the ferroelectric or high dielectric properties of the barium strontium titanate provides advantageous properties over most other insulating materials.

Figure 2:
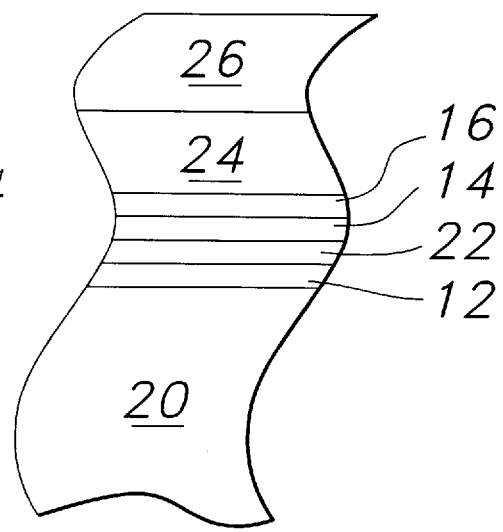
FIG. 2 shows a cross-section of an alternate embodiment of a multi-layer structure using a polycrystalline Ge buffer layer.

FIG. 2 shows an alternate embodiment, again in which the germanium (and thus all layers above it) is polycrystalline. A silicon dioxide layer 12 is on a silicon substrate 20 with a silicon nitride layer 22 atop the silicon dioxide 12. A polycrystalline germanium layer 14, a barium strontium titanate layer 16 and a lead zirconium titanate layer 24 and a titanium nitride layer 26 are successively added atop the silicon nitride layer. In this case, the barium strontium titanate 16 generally acts as a buffer layer to prevent reaction between the lead of the lead zirconium titanate 24 and the germanium 14.

Figure 3:
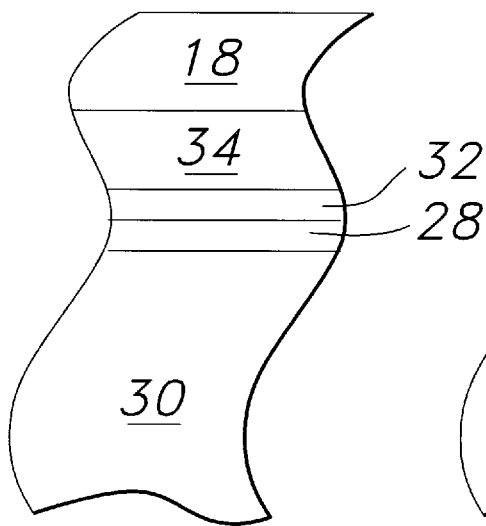
FIG. 3 shows a cross-section of an embodiment of a multi-layer structure using an epitaxial Ge buffer layer.

FIG. 3 illustrates the use of epitaxially germanium. As the single crystal germanium 28 can be epitaxially grown on the gallium arsenide substrate 30, with a good lattice match, good crystal quality can be obtained both in the germanium 28, and the epitaxially barium strontium titanate layer 32 and on into the $(Pb,Mg)NbO_3$ layer 34. The top electrode 18 can be titanium-tungsten (as in the preceding figures, annealing of the ferroelectric layer or layers can be accomplished before deposition of the top electrode, and thus reactions between the ferroelectric and a material such as titanium-tungsten can be used as reaction with the ferroelectric is minimized due to the low temperature processing of the remaining steps). It should be noted that an epitaxially structure utilizing single crystal germanium allows the germanium to be utilized as a part of a transistor, for example. Thus, single crystal germanium is useful, even if the ferroelectric material is grown under conditions which provide a polycrystalline ferroelectric.

Figure 4:
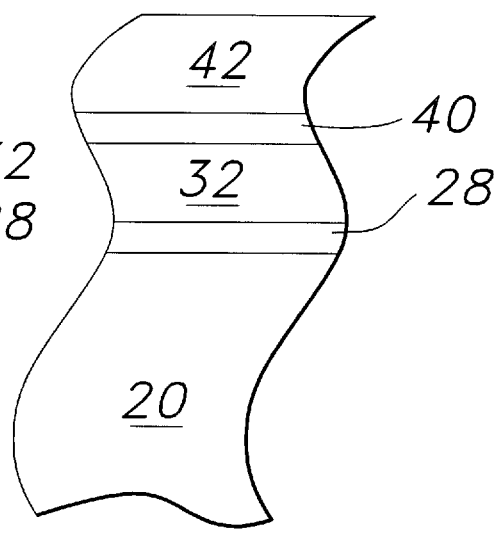
FIG. 4 shows a cross-section of an alternate embodiment of a multi-layer structure using an epitaxial Ge buffer layer.

FIG. 4 shows an alternate structure using epitaxially germanium. Here the silicon substrate 20 is covered by a germanium epitaxially layer 28, which is in turn covered by a barium strontium titanate epitaxially layer 32. A second germanium layer 40 is over the barium strontium titanate 32, and an aluminum top electrode 42 is over the second germanium layer 40. The use of a second germanium layer allows the usage of a wider variety of conductors for the top electrode and allows higher temperature processing during and after the deposition of the top electrode, as the germanium generally prevents reaction between the top electrode material and the ferroelectric material.

While a number of materials have been previously been suggested for use next to high dielectric materials (such as barium strontium titanate or lead zirconium titanate), none of these materials provides for the epitaxial growth of high dielectrical materials on a conductor or semiconductor. Further, the prior art materials generally either form a suicide (e.g. of palladium, platinum or titanium) which allows the diffusion of silicon into the high dielectric materials, or react with silicon (e.g. tin dioxide) or react with the high dielectric oxide to form low dielectric constant insulators (e.g. titanium monoxide or tantalum pentoxide). Thus the prior art conductive materials suggested for interfacing with high dielectric constant oxides with semiconductors either have reacted with the high dielectric constant oxides or with the semiconductor and/or have not provided a diffusion barrier between the high dielectric constant oxides and semiconductor material. At the annealing temperatures necessary to produce good quality high dielectric constant oxide material, such reactions generally form low dielectric constant insulators, which being in series with the high dielectric constant oxide material, dramatically lowers the effective dielectric constant. Only germanium (doped or undoped) gives a conductor or semiconductor which reacts neither with the semiconductor substrate nor the high dielectric constant oxide at the required annealing temperatures, and only germanium provides for epitaxial growth of a conductive or semiconductive material on a semiconductor substrate, in a matter compatible with growing and annealing of a high dielectric constant oxide in a non-reactive manner, such that a metal oxide metal or metal oxide semiconductor structure can be fabricated without the effective dielectric constant being significantly lowered by a low dielectric constant material between the high dielectric constant material and the underlying conductor or semiconductor.

Since various modifications of the semiconductor (e.g. silicon or gallium arsenide) structure, and the methods of fabrication thereof, are undoubtedly possible by those skilled in the art without departing from the scope of the invention, the detailed description is thus to be considered illustrative and not restrictive of the invention as claimed hereinbelow. For example, the discussion has generally used the term "ferroelectric" materials, however, the invention is generally applicable to any "high-dielectric constant oxide" and some such materials are not ferroelectric and some not titanates. The term "high-dielectric constant oxides" as used herein is to mean oxides with dielectric constants of greater than 100, and preferably greater than 1,000 (barium strontium titanate can have dielectric constants greater than 10,000). Many such oxides can be considered to be based on $BaTiO_3$ and includes oxides of the general formula $(Ba,Sr,Ca)(Ti,Zr,Hf)O_3$. Many other oxides of the general formula $(K,Na,Li)(Ta,Nb)O_3$ and still other oxides such as $(Pb,La)ZrTiO_3$ or $(Pb,Mg)NbO_3$ or $Bi_4Ti_3O_{12}$ will also work. These oxides can also be doped with acceptors such as Al, Mg, Mn, or Na, or doners such as La, Nb, or P. Other non-germanium semiconductors can also be used in addition to silicon and gallium arsenide. As used herein, the term "semiconductor" is used to mean "non-germanium semiconductor".

What is claimed is:

1. A structure useful in semiconductor circuitry, comprising:
    a semiconductor substrate;
    a buffer layer on said semiconductor substrate;
    a germanium layer on said buffer layer; and
    a high-dielectric constant oxide having a dielectric constant greater than 100 on said germanium layer.

2. The structure of claim 1, wherein said germanium layer is single-crystal.

3. The structure of claim 1, wherein said substrate is silicon.

4. The structure of claim 3, wherein said high-dielectric constant oxide is single-crystal.

5. The structure of claim 1, wherein said substrate is gallium arsenide.

6. The structure of claim 1, wherein a second germanium layer is on top of said high-dielectric constant oxide.

7. The structure of claim 6, wherein said second germanium layer is single-crystal.

8. The structure of claim 6, wherein a conducting layer is on said second germanium layer.

9. The structure of claim 8, wherein a single-crystal conducting layer is on said second germanium layer.

10. The structure of claim 1, wherein said high-dielectric constant oxide is a titanate.

11. The structure of claim 10, wherein said high-dielectric constant oxide is barium strontium titanate.

12. The structure of claim 10, wherein said high-dielectric constant oxide is a lead-containing titanate and a buffer layer of non-lead-containing titanate is between said germanium layer and said lead-containing titanate.

13. The structure of claim 1, wherein said buffer layer is a non-single crystal silicon dioxide, a silicon nitride, or silicon dioxide/silicon nitride layer on said semiconductor substrate.

14. The structure of claim 3, wherein said germanium layer is less than about 1 nm thick.

* * * * *